United States Patent                                    (10) Patent No.:     US 11,125,588 B2
Erkelenz et al.                                         (45) Date of Patent:         Sep. 21, 2021

(54) MEASURING DEVICE, TRANSMITTER HOUSING AND METHOD FOR PRODUCING A MEASURING DEVICE

(71) Applicant: KROHNE Messtechnik GmbH, Duisburg (DE)

(72) Inventors: Alexander Erkelenz, Moers (DE); Achim Matt, Duisburg (DE)

(73) Assignee: KROHNE MESSTECHNIK GMBH, Duisburg (DE)

( * ) Notice: Subject to any disclaimer, the term of this patent is extended or adjusted under 35 U.S.C. 154(b) by 132 days.

(21) Appl. No.: 16/027,675

(22) Filed: Jul. 5, 2018

(65) Prior Publication Data

US 2019/0011295 A1    Jan. 10, 2019

(30) Foreign Application Priority Data

Jul. 7, 2017    (DE) ............ 10 2017 115 259.8

(51) Int. Cl.
  *G01D 11/24*    (2006.01)
  *H05K 7/14*    (2006.01)
  (Continued)

(52) U.S. Cl.
  CPC ........... *G01D 11/245* (2013.01); *G01D 21/00* (2013.01); *H04B 1/04* (2013.01); *H05K 5/0247* (2013.01);
  (Continued)

(58) Field of Classification Search
  CPC .... G01D 11/245; G01D 11/24; H05K 7/1462; H05K 5/0217
  See application file for complete search history.

(56) References Cited

U.S. PATENT DOCUMENTS 4,047,242 A *  9/1977  Jakob ............... H05K 7/1417
                                                361/714
5,546,804 A *  8/1996  Johnson ............ G01D 11/245
                                                191/26
(Continued)

FOREIGN PATENT DOCUMENTS

DE       203 14 618 U1    11/2003
JP       2011146436 A      7/2011

OTHER PUBLICATIONS

IEC CEI 60664-1, International Standard, International Electrotechnical Commission, Basic Safety Publication, Insulation Coordination for Equipment Within Low-Voltage Systems—Part 1 Principles, Requirements and Tests, Second Edition, Apr. 2007, English Version of the Table of Contents and Machine Translation of Relevant Parts.

(Continued)

*Primary Examiner* — Helen C Kwok
(74) *Attorney, Agent, or Firm* — David S. Safran; Roberts Calderon Safran & Cole, P.C.

(57) ABSTRACT

A measuring device with at least one sensor and at least one transmitter housing, wherein the transmitter housing has at least one terminal space and an electronics space adjacent to the terminal space and connected via a partition wall, wherein at least a first electronic device for the connection of supply and/or I/O lines is arranged in the terminal space and wherein at least a second electronic device is arranged in the electronics space with electronics for controlling the sensor, wherein the first electronic device and the second electronic device are electrically conductively connected to one another via a contacting unit, wherein the contacting unit is removably inserted into a recess of the partition wall. The A measuring device that is simple to produce and whose components can be particularly easily replaced is achieved (Continued)

by the contacting unit being firmly connected to the first electronic device.

13 Claims, 6 Drawing Sheets

(51) Int. Cl.
*G01D 21/00* (2006.01)
*H04B 1/04* (2006.01)
*H05K 5/00* (2006.01)
*H05K 5/02* (2006.01)

(52) U.S. Cl.
CPC ......... *H05K 7/1462* (2013.01); *H05K 5/0026* (2013.01); *H05K 5/0213* (2013.01); *H05K 5/0256* (2013.01)

(56) References Cited

U.S. PATENT DOCUMENTS

| | | | | |
|---|---|---|---|---|
| 6,508,131 B2* | 1/2003 | Frick | ................... | G01D 11/245 |
| | | | | 73/756 |
| 6,556,447 B2* | 4/2003 | Cudini | ................... | G01D 11/24 |
| | | | | 174/551 |
| 7,036,381 B2* | 5/2006 | Broden | ............... | G01L 19/0645 |
| | | | | 73/708 |
| 7,134,354 B2* | 11/2006 | Nelson | ................... | G01D 11/24 |
| | | | | 73/866.3 |
| 7,816,772 B2* | 10/2010 | Engel | ..................... | G01D 5/147 |
| | | | | 257/676 |
| 8,128,284 B2 | 3/2012 | Martensson | | |
| 8,336,408 B2 | 12/2012 | Hershey et al. | | |
| 8,961,008 B2 | 2/2015 | Bronczyk et al. | | |
| 9,030,190 B2 | 5/2015 | Matt | | |
| 9,065,222 B2* | 6/2015 | Drew | ..................... | H01R 12/71 |
| 9,479,201 B2 | 10/2016 | Larson et al. | | |
| 9,541,428 B2* | 1/2017 | Fink | ................... | H01R 13/5216 |
| 9,583,901 B2 | 2/2017 | Eriksen et al. | | |
| 9,642,273 B2* | 5/2017 | Norman | ................... | H05K 5/069 |
| 9,971,316 B2* | 5/2018 | Jia | ........................... | G05B 13/02 |
| 10,001,397 B2* | 6/2018 | Matsuda | ............... | G01L 19/143 |
| 10,015,899 B2* | 7/2018 | Hausler | ................... | G01D 21/00 |
| 10,054,469 B2* | 8/2018 | Hiron-Jones | ........ | G01D 11/245 |
| 10,873,790 B2* | 12/2020 | Brockhaus | ............... | H04Q 9/00 |
| 2007/0201192 A1 | 8/2007 | McGuire et al. | | |
| 2010/0089635 A1* | 4/2010 | Hoeland | ................ | G01D 11/24 |
| | | | | 174/520 |
| 2011/0317390 A1* | 12/2011 | Moser | ................... | G01D 11/245 |
| | | | | 361/807 |
| 2013/0247660 A1* | 9/2013 | Matt | ..................... | G01D 11/245 |
| | | | | 73/431 |
| 2013/0249534 A1* | 9/2013 | Matt | ..................... | G01D 11/24 |
| | | | | 324/156 |
| 2015/0274010 A1* | 10/2015 | Roth | ...................... | F16J 15/025 |
| | | | | 220/86.2 |
| 2016/0381822 A1 | 12/2016 | Hausler et al. | | |
| 2017/0089856 A1 | 3/2017 | McCoy | | |
| 2018/0182387 A1* | 6/2018 | Chua | ....................... | G06F 3/167 |
| 2019/0014391 A1* | 1/2019 | Brockhaus | ............. | G01D 4/002 |

OTHER PUBLICATIONS

IEC 61010-1, International Standard, International Electrotechnical Commission, Group Safety Requirements for Electrical Equipment for Measurment, Control, and Laboratory Use—Part 1: General Requirements, Edition 3L.0, Jun. 2010, English Version of the Table of Contents and Relevant Parts Are Table 6 on p. 55 and Table 7 on p. 56, Which Can Be Understood Without Translation.

IEC 60079-11, International Standard, International Electrotechnical Commission, Explosive Atmospheres—Part 11, Equipment Proteciton by Intrinsic Safety "I", Edition 6.0, Jun. 2011, English Version of the Table of Contents as Well as a Machine Translation of the Relevant Parts.

* cited by examiner

MEASURING DEVICE, TRANSMITTER HOUSING AND METHOD FOR PRODUCING A MEASURING DEVICE

BACKGROUND OF THE INVENTION

Field of the Invention

The invention is based on a measuring device with at least one sensor and with at least one transmitter housing, wherein the transmitter housing has at least one terminal space and an electronics space adjacent to the terminal space and connected via a partition wall, wherein at least a first electronic device for the connection of supply and/or I/O lines is arranged in the terminal space and wherein at least a second electronic device is arranged in the electronics space with electronics for controlling the sensor, wherein the first electronic device and the second electronic device are electrically conductively connected to one another via a contacting unit and wherein the contacting unit is removably inserted into a recess of the partition wall.

Moreover, the invention relates to a transmitter housing and a method for producing a measuring device, wherein the measuring device has at least one sensor and at least one transmitter housing, wherein the transmitter housing has at least one terminal space and an electronics space adjacent to the terminal space and connected via a partition wall, wherein at least one first electronic device for the connection of supply and/or I/O lines is arranged in the terminal space and wherein at least a second electronic device with electronics is arranged in the electronics space, wherein the second electronics device arranged in the electronics space has a terminal unit, wherein a contacting unit is provided that is firmly connected to the first electronic device, wherein the contacting unit has contact elements in the form of network contact elements and/or signal contact elements for transmitting electric signals, and wherein the terminal unit has connecting elements in the form of network connecting elements and/or signal connecting elements.

Description of Related Art

Measuring devices are known from the prior art which, in addition to a sensor unit for recording physical or chemical measured variables, have a modular electronic unit for controlling and supplying the sensor unit and for forwarding and/or evaluating the recorded measured data. Usually, the electronic device is arranged in a housing. In this case, depending on the field of application of the measuring device, in particular the type of explosion risk, different requirements are placed on the housing and/or on the design of the electronic device to prevent the formation and/or propagation of an explosion.

The following types of protection for electrical equipment are relevant in the context of the invention:

"Ex-e" means the requirement for the construction of equipment subject to increased safety. Measures are taken to prevent sparks from forming in internal or external parts of electrical components. Such measures are, for example, over-dimensioning of critical points, increased operating and basic insulation, overload protection, safe connection of incoming lines and/or adequate mechanical protection.

"Ex-i" refers to the requirements for the intrinsic safety of circuits or the limitation of energy in electrical circuits. This includes, in particular, that an intrinsically safe circuit is separated with a sufficient distance from other circuits. The distance between two circuits corresponds to the shortest path between these circuits. A distinction is always made by the type of medium through which the path of the shortest distance leads, so that there are different minimum distances for air gaps, distances through casting compound, distances through solid insulation, creepage distances in air or creepage distances under protective layer.

To determine the minimum distances to be observed, reference is made to the standards IEC 60664-1: 2007, IEC 61010-1: 2010 and IEC 60079-11: 2011, the contents of which are expressly incorporated into the present application.

"Ex-d" refers to the requirement for the design of a housing as pressure-resistant casing, wherein explosions are allowed under this type of protection inside the housing, however their impact on the surroundings should be prevented by a pressure-resistant design of the housing.

In the context of the present invention, a distinction is made between designs that meet the requirements for ensuring an explosion-proof measuring device, and further between designs that are suitable for use in an environment that is not at risk for explosions.

In the context of the present invention, a modular electronic unit for controlling and supplying the sensor unit as well as for forwarding and/or evaluating the recorded measurement data comprises both the electronics for operating the sensor and terminals for supply and I/O lines, i.e. input/output lines. Usually, these two units are arranged in separate chambers.

In detail, the electronics for operating the sensor are arranged in an electronics space. Furthermore, the electronics space can have a connection to the sensor unit of the measuring device.

The terminals for supply and I/O lines are arranged in a terminal space. By separating the two spaces, explosions resulting in the electronics space can be prevented, in particular, from propagating unhindered in the terminal space.

The second electronic device arranged in the electronics space and the first electronic device arranged in the terminal space are connected to one another in measuring devices known from the prior art by means of a contacting unit, wherein both power and electrical signals in the form of voltages are transmitted via the contacting unit.

From the prior art, German Utility Model DE 203 14 618 U1, for example, shows that a measuring device with a housing is known, wherein the housing has two chambers which are connected to one another via a passage space, wherein the passage space is cast with a casting compound. For transmission of power and electrical signals, a plug connector is provided, which is connected to the housing by a screw.

German Patent Application Publication DE 10 2012 005 637 A1 and corresponding U.S. Pat. No. 9,030,190 B2 disclose a measuring device with a housing, wherein the housing has two chambers and wherein the two chambers are connected to one another via an encapsulated contacting element. Since the contacting element is already encapsulated in itself and thus there is no longer any need for encapsulation in the housing, defective components can be exchanged particularly easily, since only plug connections have to be disconnected.

SUMMARY OF THE INVENTION

Based on this prior art, the object of the present invention is to provide a transmitter housing and a measuring device, which is easy to produce and whose components can be particularly easily replaced. In addition, the object of the invention is to provide a method for producing such a measuring device.

According to a first teaching of the present invention, the aforementioned object is achieved by a measuring device mentioned at the outset in that the contacting unit is firmly connected to the first electronic device.

According to the invention, it has been recognized that when the contacting unit is firmly connected to the first electronic device, these two components are, on the one hand, particularly easy to install as an assembly and, on the other hand, are particularly easy to replace, whereby the measuring device has a particularly high modularity in total. In the context of the present invention, a firm connection means a removable or non-removable connection, so that the contacting unit and the electronic device can be handled as one component. For example, a firm connection can be an adhesive connection, a connection by means of soldering or a latching connection. Particularly preferably, the connection is designed as a rigid connection, wherein the contacting unit is also designed as a rigid, non-flexible component.

According to a preferred design, the first electronic device is removably connected to the transmitter housing via at least one fastening means. For example, the first electronic device is bolted to the transmitter housing. Preferably, at least one screw or other fastening means or at least two screws or two other fastening means is/are arranged immediately adjacent to the contacting unit in order to stabilize the contacting unit. In this case, the screws or the other fastening means lie directly against the contacting unit and/or touch the contacting unit. In addition, preferably at least one connection between the first electronic device and the transmitter housing is designed as a secure connection to the housing. For this, preferably the first electronic device, in particular the ground potential of the first electronic device, is electrically conductively connected to the transmitter housing.

According to an advantageous design, the first electronic device comprises a first printed circuit board and/or the second electronic device comprises a second printed circuit board.

Particularly preferably, the shape of the first electronic device is at least partially adapted to the inner shape of the terminal space and/or the shape of the second electronic device is at least partially adapted to the inner shape of the electronics space. If the transmitter housing has a circular cross-section at least in the region of the terminal space and/or the electronics space, preferably the first and/or the second electronic device also has the shape of a circle or of a circle section, in particular of a semicircle.

In addition, the first electronic device preferably has at least one terminal element for contacting the network terminal and at least one terminal element for contacting the signal transmitting elements. The aforementioned terminal elements are preferably designed as terminals.

According to a further design, the first electronic device and the terminal space are configured such that the connection cables in the terminal space running to the terminal elements during operation of the measuring device can be mechanically stabilized by having sufficient space.

According to a further advantageous design, the first electronic device and/or the terminal elements, for example in the form of terminals, is/are covered with an insulating material. This ensures that even if the user opens the terminal space, there is sufficient protection for the electronic connections.

According to a further advantageous design, the contacting unit is designed as an electrical feedthrough element, preferably as a plug with contact elements glazed or molded in plastic, in particular wherein the plug is enclosed in a metal cylinder. A glass/metal feedthrough element is advantageously suitable for use in potentially explosive environments. A feedthrough element made of plastic is suitable for use in non-hazardous environment.

According to a next advantageous design, the contacting unit has the contact elements in the form of network contact elements and/or signal contact elements for transmitting electrical signals. The contact elements can be configured as pins or as sockets. The contact elements are preferably arranged in pairs.

According to one design, the network contact elements have a larger cross-section compared to the signal contact elements.

It is advantageous when the network contact elements and/or the signal contact elements are at least partially firmly bonded to the first electronic device. For example, the contact elements can be soldered to the first electronic device.

It is also advantageous when the contact elements are arranged within a protective collar, whereby ignition protection of the measuring device can be increased.

Furthermore, it is advantageous when the first electronic device is fixedly connected with the contact elements of the contacting unit and that the first electronic device has means for increasing the distance, in detail to increase creepage distances, for example at least one bore and/or at least one slot between the network contact elements and the signal contact elements and/or between the signal contact elements with one another and/or between the network contact elements with one another. In this case, the bore and/or the at least one slot is/are preferably introduced by means of milling in the first electronic device. The at least one bore may be circular and/or have any other geometry adapted to the use. In addition, the at least one slot may be bent or straight and in particular have any geometry adapted to the use. In particular, at least one contact element can also be completely enclosed by a recess.

According to this design, the separation distances between the individual contact elements required for ensuring an explosion-proof component can be ensured even in confined spaces.

According to a further advantageous design, the signal contact elements are arranged circularly in at least one circle around at least one network contact element. As a result of the circular arrangement, according to a preferred design, it is ensured that, given a correspondingly selected radius of the circle, all the signal contact elements maintain the required minimum distance to the at least one network contact element to ensure explosion safety.

In addition, it is also conceivable and advantageous when the signal connection elements are arranged in a different geometric shape around at least one network connecting element.

According to one design, the signal connecting elements are arranged, preferably circularly, around the at least one network connecting element such that the distance between the at least one network connecting element and the signal connecting elements corresponds at least to the standardized minimum distance for maintaining the air and creep resistance.

Particularly preferably, the signal contact elements are arranged in at least two circles with different radius or distance to the at least one network contact element. In this case, all signal contact elements preferably have the required minimum distance to the network contact elements to ensure explosion safety. For example, it can further be provided that at least one distance between at least one signal contact element and one network connecting element and/or at least one distance between two signal contact elements and/or at least one distance between the network connecting elements falls below the required minimum distance to ensure explosion protection. Although such a design can only be used in a non-hazardous environment, this design has the advantage that particularly many contact elements are available in a limited space for signal transmission. For example, gigabit Ethernet connections can also be implemented in a small space.

According to one design, the contacting unit has at least 15 contact elements. According to a next design, the contacting unit has at least 22 contact elements.

According to a next advantageous design, the signal contact elements are combined to form at least one circuit group, wherein the at least one circuit group has at least two signal contact elements. Particularly preferably, at least two physically separate circuit groups are present. In this case, the distance between the circuit groups, i.e. the smallest distance between the signal contact elements of the different circuits, corresponds to at least the standardized minimum distance to ensure explosion safety.

According to a further design, the contacting unit is designed such that within at least one circuit group or between at least two circuit groups, at least one distance between two signal contact elements falls below the standardized minimum distance for maintaining the air and/or creep resistance. This design is only suitable for use in a non-hazardous environment, but has the advantage that many contact elements can be made available in a particularly small space.

According to a next design of the measuring device according to the invention, the second electronic device arranged in the electronics space has a terminal unit which is electrically conductively connected to the contacting unit. Particularly preferably, the terminal unit is covered with an insulating material.

Particularly preferably, the terminal unit has connecting elements in the form of network connecting elements and/or signal connecting elements, wherein the connecting elements are electrically conductively connected to the contact elements by means of a plug connection, wherein the plug connection has a joining direction, wherein the terminal unit is fixed in the joining direction and wherein the terminal unit is arranged to float perpendicular to the joining direction, such that it adapts to the position of the contacting unit in connecting to the contacting unit.

According to this design, the connection between the terminal unit and the contacting unit is designed to be self-centering. For example, the terminal unit is arranged floating in a holder. This design has the advantage that the terminal unit can be connected in a particularly simple and flexible manner to the contacting unit during assembly of the measuring device.

A self-centering connection can, for example, be implemented in that the connecting elements and/or the contact elements are designed as funnel-shaped receptacles. Particularly preferably, the funnel-shaped receptacles have a sufficient tolerance range, preferably between 0.2 and 0.5 mm, particularly preferably between 0.2 and 0.3 mm.

According to one design, the opening of the funnel-shaped receptacles has a diameter between 0.2 and 0.5 mm and particularly preferably between 0.2 and 0.3 mm, wherein the neck of the funnel-shaped receptacles tapers at least in sections.

According to a further preferred design, the second electronic device has an at least partially bendable circuit board. By way of example, the printed circuit board can be configured as a flex printed circuit board or as a rigid-flex printed circuit board or as a semiflexed printed circuit board or as a TWINflex® printed circuit board. Particularly preferably, the printed circuit board has at least two rigid printed circuit board parts and at least one bendable part. Particularly preferably, the terminal unit is configured as a rigid part of the bendable printed circuit board. Furthermore, it is advantageous when the at least two rigid parts of the bendable circuit board form an angle, preferably an angle between 90° and 180° or between 90° and 160° or a 90° angle or an angle between 45° and 90°. Overall, the transmitter housing can thus be made particularly compact.

According to a further particularly preferred design, the bendable printed circuit board comprises internal conductor tracks. To ensure explosion protection, smaller requirements are placed on the distances between internal conductor tracks. In this respect, an explosion-proof measuring device can be provided which at the same time provides a high number of signal transmitting elements in a small space.

The electronics arranged in the electronics space for controlling the sensor are preferably designed as a compact device insert, which is connected via plug connection to the second electronic device. A compact device insert can, for example, comprise stacked, assembled printed circuit boards which are connected to the second electronic device by means of a plug connection. This design has the advantage that the entire electronics is particularly easy to replace as a module.

According to a further design, the second electronic device is removably connected to the transmitter housing, for example by a screw connection. Furthermore, a secure connection between the second electronic device and the transmitter housing is preferably provided. A secure connection is preferably implemented by a conductive connection of the ground potential of the second electronic device to the transmitter housing.

In principle, the transmitter housing can be configured such that the electronics space or the elements arranged in the electronics space and the terminal space or the elements arranged in the terminal space meet the requirements of the same types of protection classes or different types of protection classes.

For example, both the electronics space and the terminal space can meet the requirements for contact protection and electromagnetic compatibility without being suitable for use in potentially explosive environments.

In addition, both the electronics space and the terminal space can meet the requirements for contact protection and electromagnetic compatibility, whereby the electronics space is additionally pressure resistant (Ex-d) and the terminal space meets the requirements of increased safety (Ex-e).

Furthermore, both the electronics space and the terminal space can meet the requirements for contact protection and electromagnetic compatibility, whereby the electronics space is additionally pressure resistant (Ex-d) and a safe separation between Ex-e signals (mains voltage) and Ex i Signals (I/O connection) is guaranteed.

In addition, both the electronics space and the terminal space can meet the requirements with respect to contact protection and electromagnetic compatibility and, in addition, pressure resistance (Ex-d).

Finally, both the electronics space and the terminal space can meet the requirements with respect to contact protection and electromagnetic compatibility and additionally pressure resistance (Ex-d), wherein the contacting unit is not designed to be pressure resistant.

According to a second teaching of the present invention, the object derived at the outset is achieved by a transmitter housing, wherein the transmitter housing has at least one terminal space and an electronics space adjacent to the terminal space and connected via a partition wall, wherein at least one first electronic device for the connection of supply and/or I/O lines is arranged in the terminal space and wherein at least a second electronic device is arranged in the electronics space with electronics for controlling the sensor, wherein the first electronic device and the second electronic device are electrically conductively connected to one another via a contacting unit, wherein the contacting unit is removably inserted into a recess of the partition wall. The transmitter housing is wherein the contacting unit is fixedly connected to the first electronic device and in that the transmitter housing is designed for use in a measuring device according to the above description.

According to a next teaching of the present invention, the above-mentioned object is achieved by an aforementioned method for producing a measuring device, wherein the method comprises the following steps:

installing the second electronic device in the electronics space, wherein the connection unit is arranged floating, installing the first electronic device in the terminal space, wherein the contacting unit is removably inserted into the partition wall, wherein, by installing the first electronic device, the contacting unit is connected to the terminal unit, wherein the terminal unit adapts to the position of the contacting unit by self-centering.

Due to the self-centering connection between the connecting unit and the connecting element, the method according to the invention has the advantage that the installation of such a measuring device is particularly simple.

The measuring device produced in this manner is preferably designed according to one of the previously described designs. In detail, there is a plurality of possibilities for designing and further developing the measuring device and the method according to the invention will be apparent from the following description of preferred embodiments in conjunction with the drawings.

DETAILED DESCRIPTION OF THE INVENTION

Figure 1:
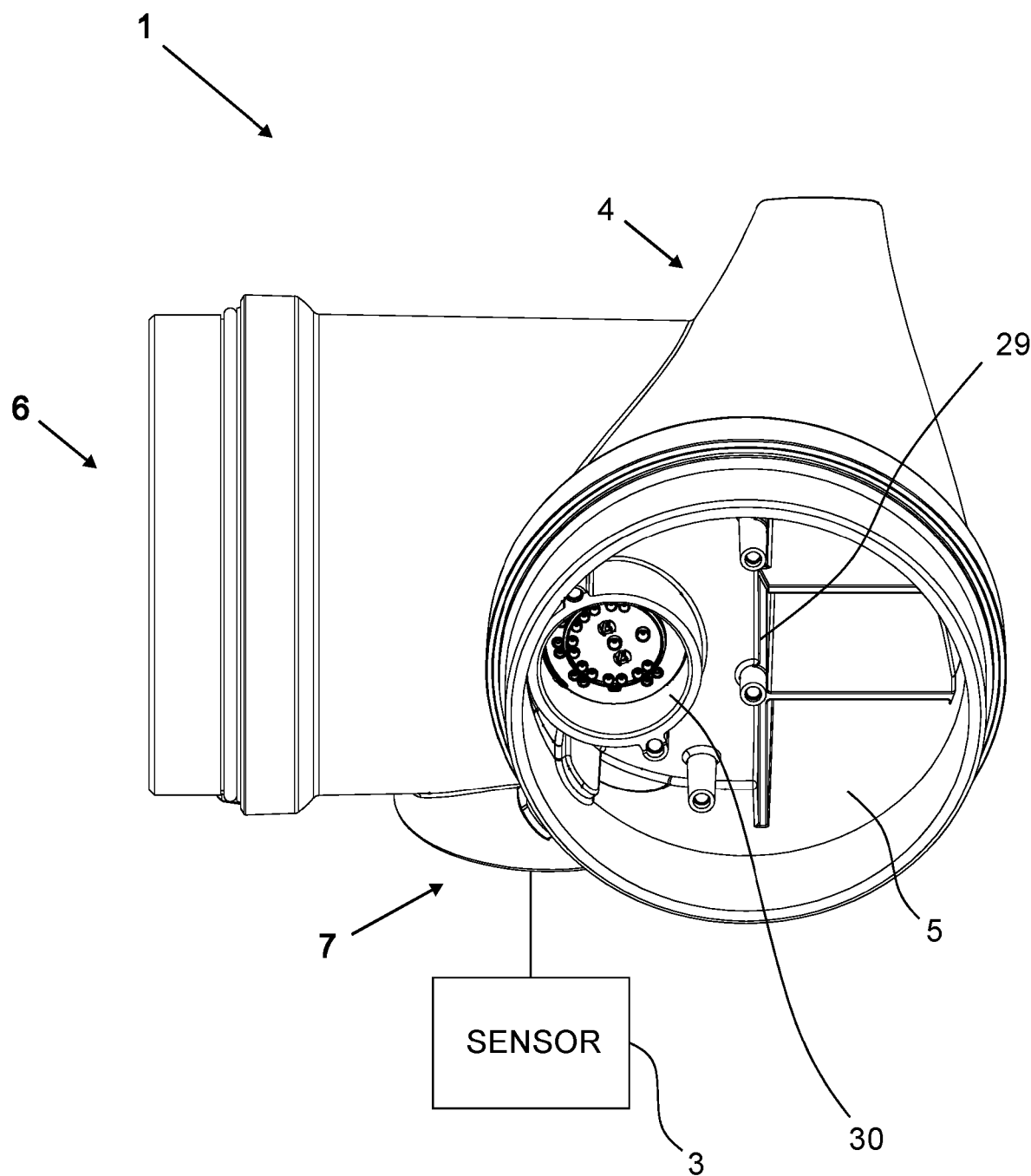
FIG. 1 is a perspective view of a first embodiment of a measuring device.

FIG. 1 shows a representation of a measuring device 1 with a sensor 3 for receiving a physical measured variable and with a transmitter housing 4. The transmitter housing 4 comprises a terminal space 5 and an electronics space 6 adjacent to the terminal space 5 and connected via a partition wall 29, wherein the terminal space 5 is empty or has no electronic device in the illustrated measuring device. The partition wall 29 has a recess 30 for receiving a contacting unit 12. In addition, the electronics space 6 has a connection 7 to the sensor 3.

Figure 2:
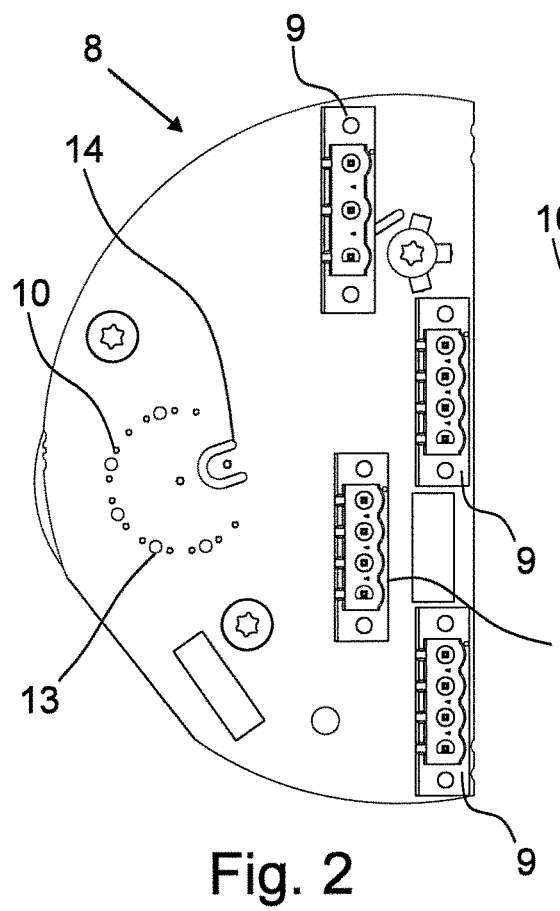
FIG. 2 is a plan view of a first embodiment of a first electronic device.

In FIG. 2, a first embodiment of a first electronic device 8 in the form of a printed circuit board, which is arranged in the terminal space 5 during operation, is shown. The printed circuit board is designed semicircular and is adapted in shape to the shape of the inner cross section of the terminal space 5. Terminals 9 for the connection of supply and I/O lines 33 are arranged on the circuit board. In addition, through connections 10 are present, which are firmly connected to the contact elements 11 of the contacting unit 12, as shown below. In the illustrated embodiment, the contact elements 11 are soldered to the through connections 10. In this respect, the circuit board and the contacting unit 12 can be handled as an assembly and, in particular, installed as a unit and also replaced. To increase the distance between the through connections 10 and the contact elements 11, circular holes 13 and a curved slot 14 are present in the circuit board.

Figure 3:
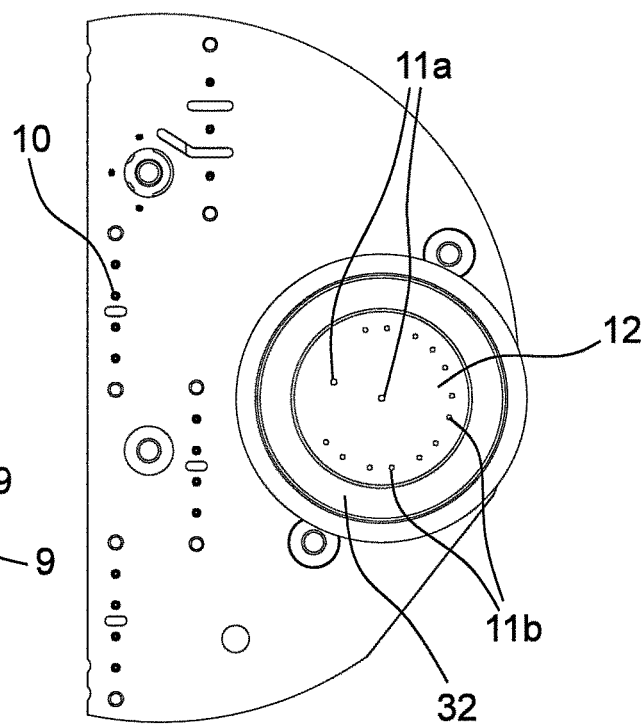
FIG. 3 is a rear view of a first embodiment of a first electronic device.

FIG. 3 shows the circuit board shown in FIG. 2 in rear view. The illustration shows the side of the circuit board, which faces the electronics space 6 in the operating state. In addition to the through connections 10 for connection via the terminals 9, there is a contacting unit 12 in the form of an electrical feedthrough element with contact elements 11 in the form of network contact elements 11a and signal contact elements 11b. The signal contact elements 11b are arranged in such a circular manner around the network contact elements 11a that the distance between the network contact elements 11a and the signal contact elements 11b corresponds to the standardized minimum distance for maintaining the air and creep resistance. The requirements for the distance between the signal contact elements 11b with one another are lower. In the illustrated embodiment, the distances between the signal contact elements 11b are dimensioned such that the circuit board is suitable for use in potentially explosive environments. In addition, the feedthrough element has a protective collar 32, which increases the ignition protection safety.

Figure 4:
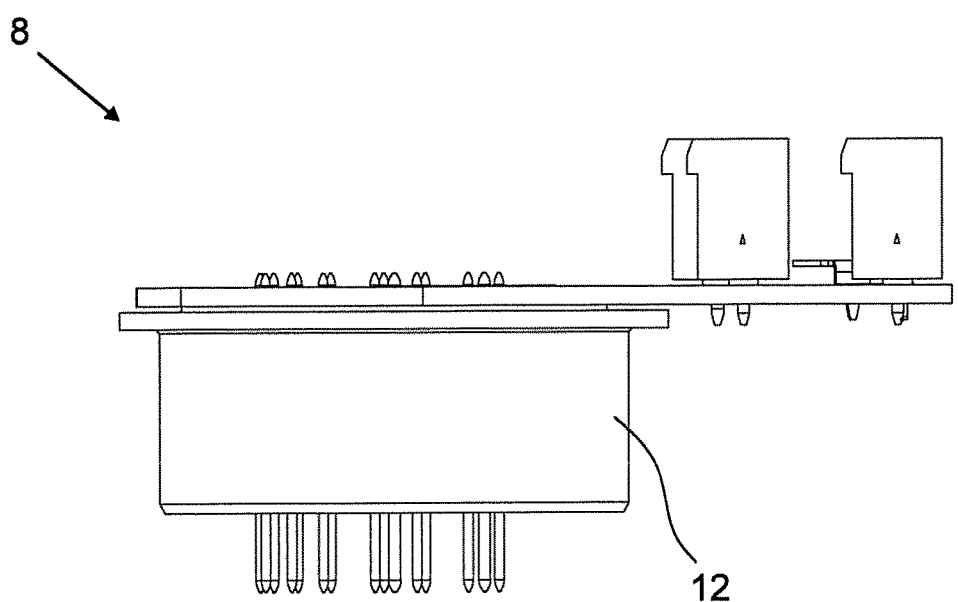
FIG. 4 is a side view of the first embodiment of the first electronic device.

In FIG. 4, the first embodiment of the first electronic device 8 is shown in side view.

Figure 5:
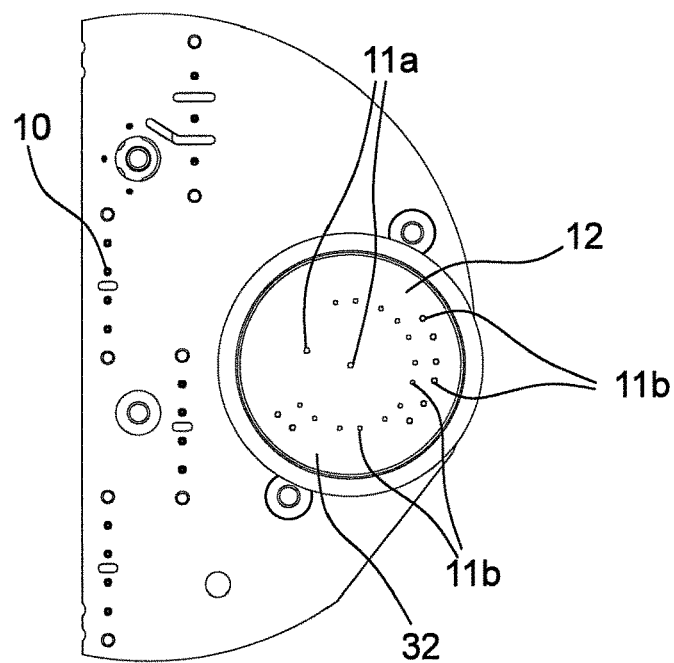
FIG. 5 is a plan view of a second embodiment of a first electronic device.

FIG. 5 likewise shows a first electronic device 8 to be arranged in the terminal space 5 in the form of a printed circuit board together with a contacting unit 12 in the form of an electrical feedthrough element arranged on the printed circuit board and permanently connected to the printed circuit board. The contact elements 11b arranged on the feedthrough element are arranged in two circles around the network contact elements 11a. In this case, the distance between the signal contact elements 11b arranged on the inner circle and the network contact elements 11*a* corresponds to the minimum distance required to ensure air and creep resistance. However, the distance of the signal contact elements 11*b* arranged on the outer circle to the signal contact elements 11*b* arranged on the inner circle is less than the required minimum distance, so that the unit shown is only suitable for use in a non-hazardous environment. In an advantageous manner, the electrical feedthrough element has a particularly large number of signal contact elements 11*b* for transmitting electrical signals.

Figure 6:
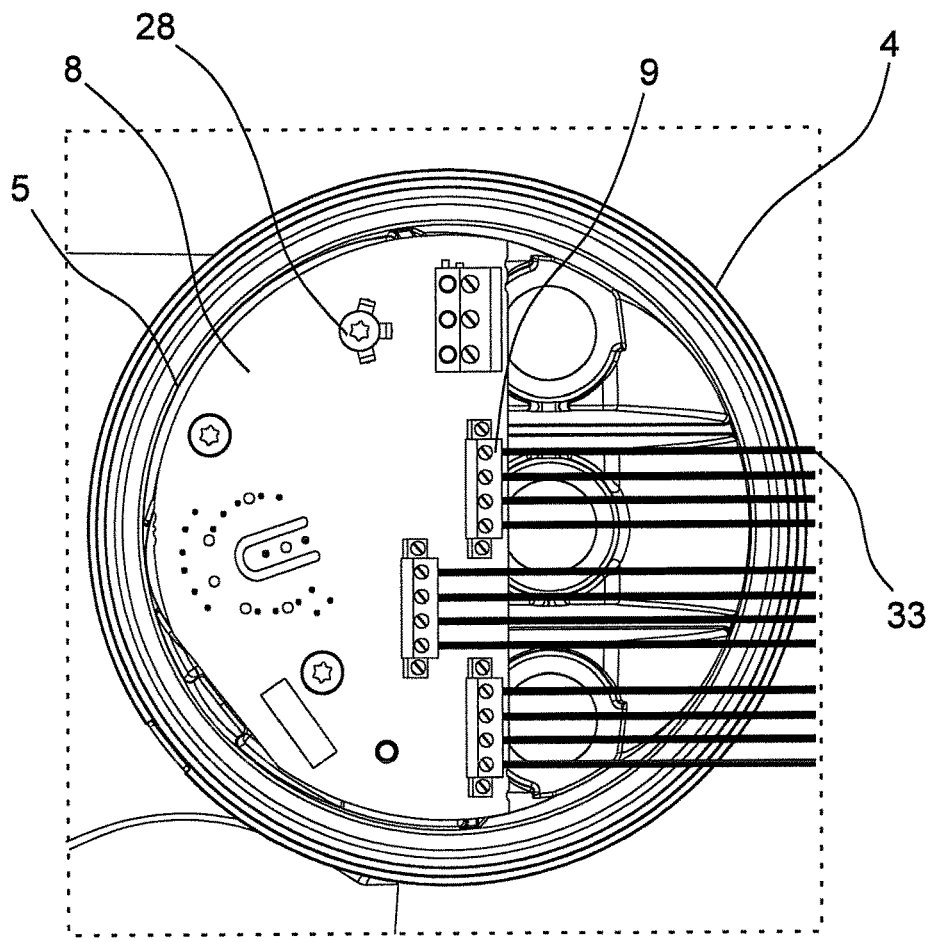
FIG. 6 is a plan view of a third embodiment of a first electronic device in a transmitter housing.

FIG. 6 shows a first electronic device 8 arranged in the terminal space 5 in the form of a printed circuit board. Terminals 9 are arranged on the circuit board, which are connected to I/O lines 33. In addition, the circuit board is connected via a screw connection to the transmitter housing 4. Furthermore, a secure connection 28 is provided, which electrically conductively connects the ground potential of the circuit board to the transmitter housing 4.

Figure 7:
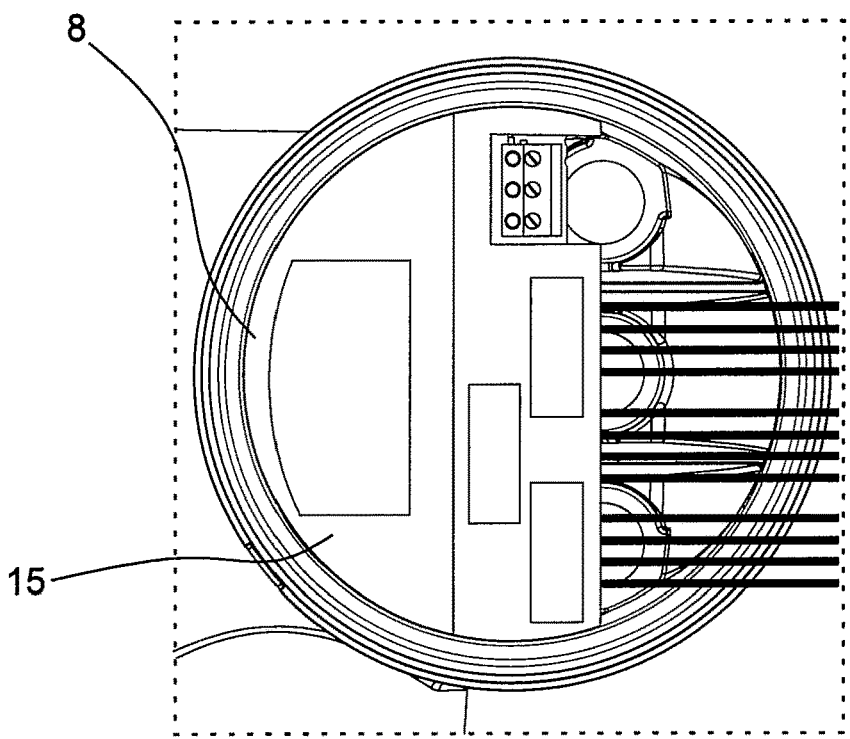
FIG. 7 is a plan view of a fourth embodiment of a first electronic device in a transmitter housing.

The first electronic device 8 in the form of a printed circuit board shown in FIG. 7 is likewise arranged in a terminal space 5. To protect the user, the circuit board and the terminals 9 are provided with an insulating cover 15.

Figure 8:
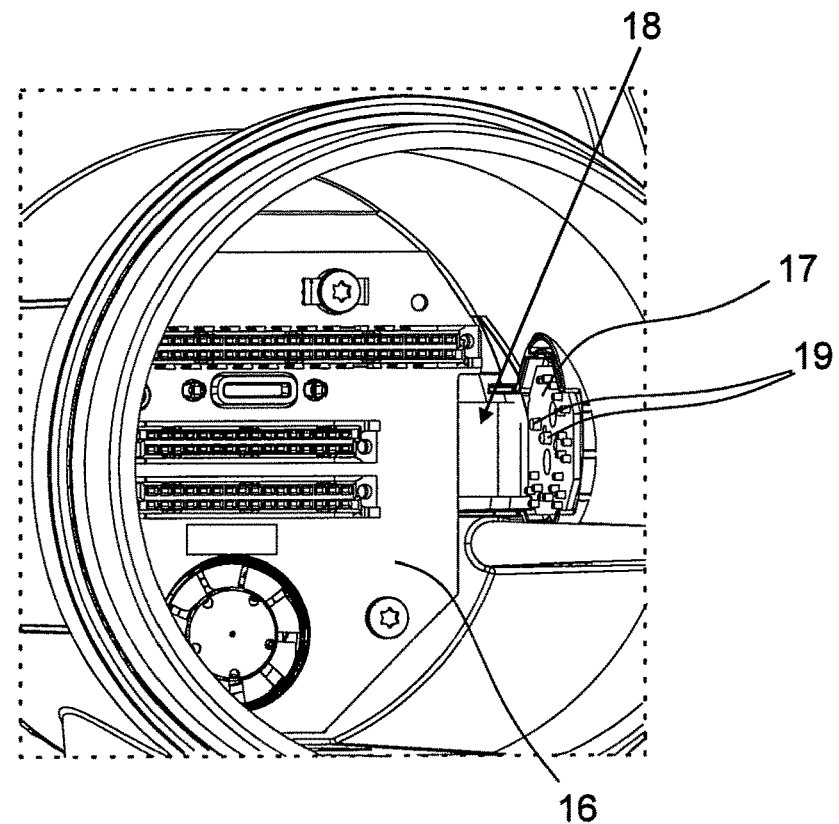
FIG. 8 is a perspective view of a first embodiment of a second electronic device in a transmitter housing.

FIG. 8 shows a first embodiment of a second electronic device 16 in the form of a printed circuit board. The printed circuit board is arranged in the electronics space 6 of a transmitter housing 4. The circuit board is configured as a rigid-flex circuit board, wherein two rigid circuit board parts are connected to one another via a flexible part 18. The printed circuit board further comprises a terminal unit 17 for connection to the electrical feedthrough element arranged in the terminal space 5. The terminal unit 17 has connecting elements 19 in the form of network connecting elements 19*a* and signal connecting elements 19*b*, wherein the signal connecting elements 19*b* corresponding to the signal contact elements 11*b*, as shown in FIG. 5, are arranged in two circles around the network connecting elements 19*a*.

The connecting elements 19 are designed such that they can be electrically conductively connected to the contact elements 11 by means of a plug connection. The connecting elements 19 are designed funnel-shaped. The connecting unit 17 is arranged floating in a holder perpendicular to the joining direction of the plug connection and can thus be adapted to the position of the feedthrough element in the connection with the contact elements 11. Overall, the connection between the connecting elements 19 and the contact elements 11 is designed to be self-centering.

Figure 9:
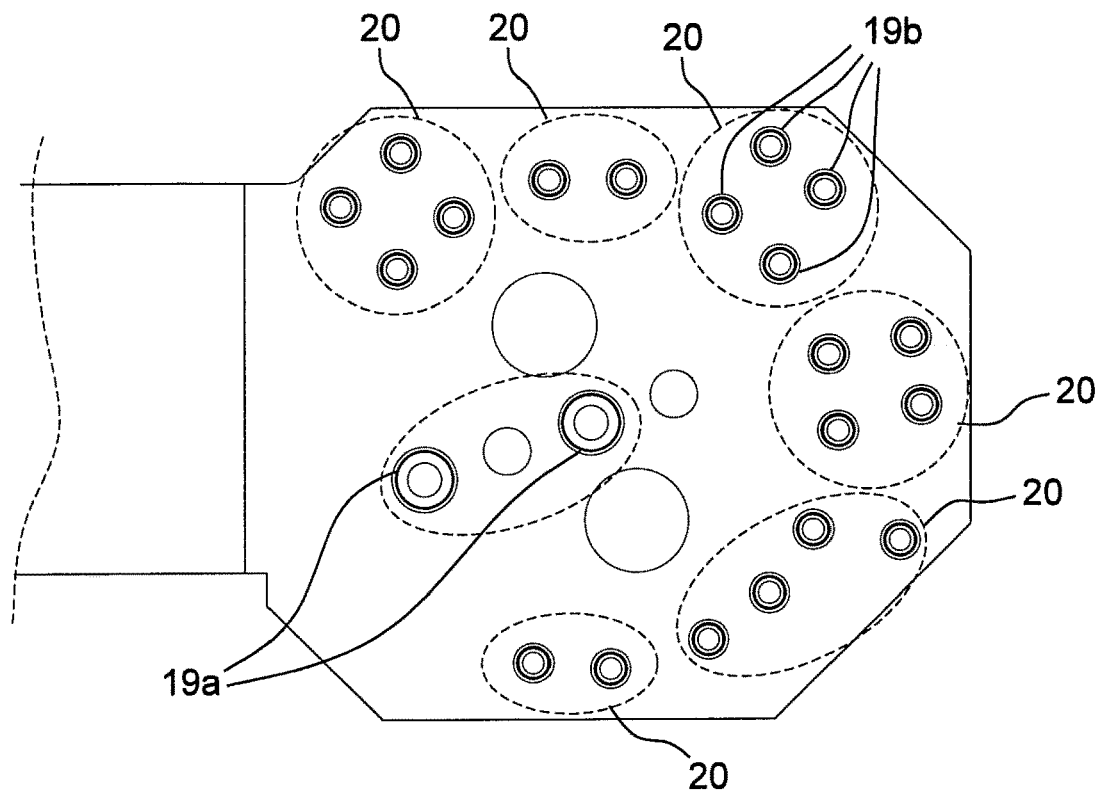
FIG. 9 is a plan view of a terminal unit of the first embodiment of the second electronic device.

FIG. 9 shows the terminal unit 17 of the first embodiment of the second electronic device 16. The terminal unit 17 has network connecting elements 19*a* and signal connecting elements 19*b*, wherein the signal connecting elements 19*b* are arranged circularly in two circles around the network connecting elements 19*a*. In addition, the signal connecting elements 19*b* are arranged grouped on circuit groups 20 on the connecting unit 17.

Figure 10:
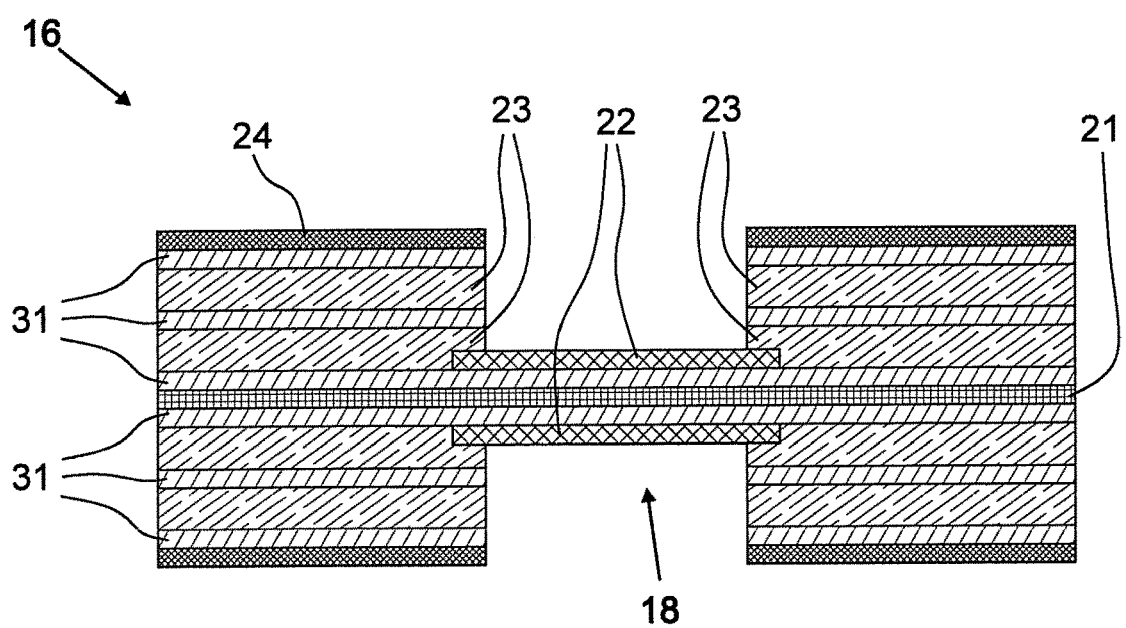
FIG. 10 is a sectional view of an embodiment of a multilayer second electronic device and FIG. 11 is a block diagram of a first embodiment of a method according to the invention.
Figure 11:
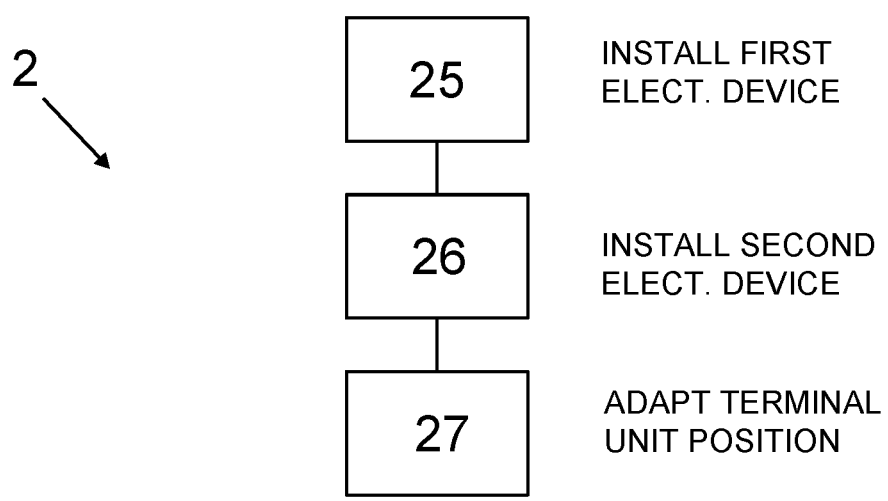

FIG. 10 shows the construction of an embodiment of the rigid-flex circuit board arranged in the electronics space 6. The printed circuit board is designed as a multi-layer flex circuit board with internal conductor tracks. In the embodiment illustrated, the rigid printed circuit board parts each have six metallization layers 31 arranged one above the other. The flexible part 18 of the rigid-flex circuit board has two metalization layers, each covered with insulating material. A foil 21 made of flex polyimide with a thickness of about 50 microns is arranged internally, through which the flexible part 18 of the circuit board is bendable. The flexible part 18 of the rigid-flex circuit board 16 is further covered by a polyimide protective layer 22 having a thickness of between 25 and 50 μm. Furthermore, the printed circuit board has intermediate layers 23 of pre-impregnated fiber material, each having a thickness between 250 microns and 600 microns. The rigid part of the circuit board 16 has a solder cover 24. FIG. 11 shows a method 2 for producing a measuring device 1, wherein the measuring device 1 has a sensor 3 and a transmitter housing 4, wherein the transmitter housing 4 has a terminal space 5 and an electronics space 6 adjacent to the terminal space 5 and connected via a partition wall 29, wherein a first electronic device 8 is arranged in the terminal space 5 for the connection of supply and I/O lines 33 and wherein a second electronic device 16 is arranged with electronics in the electronics space 6 for controlling the sensor 3, wherein the second electronic device 16 arranged in the electronics space 6 has a connecting unit 17, wherein a contacting unit 12 is present in the form of an electrical feedthrough element which is firmly connected to the first electronic device 8, wherein the contacting unit 12 has contact elements 11 in the form of network contact elements 11*a* and signal contact elements 11*b* for transmitting electrical signals, wherein the terminal unit 17 has connecting elements 19 in the form of network connecting elements 19*a* and signal connecting elements 19*b*.

The method 2 comprises the following steps:

installation 25 of the second electronic device 16 in the electronics space 6, wherein the connecting unit 17 is arranged to float, installation 26 of the first electronic device 8 in the terminal space 5, wherein the contacting unit 12 is removably inserted into the partition wall, wherein, by installing 26 the first electronic device 8, the contacting unit 12 is connected to the connecting unit 17, wherein the terminal unit 17 adapts 27 to the position of the contacting unit 12 by self-centering to the position of the contacting unit 12.

The illustrated method has the advantage that producing a measuring device 1, in particular the connection of the electrical feedthrough element to the connecting unit 17 is particularly simple, whereby both the production and replacement of the assembly of the electrical feedthrough element and the first electronic device 8 is particular easy.

What is claimed is:

1. Measuring device, comprising:
   at least one sensor,
   at least one first electronic device,
   at least one second electronic device, and
   at least one transmitter housing,
   wherein the transmitter housing has at least one terminal space and an electronics space adjacent to the terminal space and connected via a partition wall,
   wherein the at least one first electronic device is for the connection of at least one of supply or I/O lines and is arranged in the terminal space and
   wherein the at least one second electronic device is arranged in the electronics space and has electronics for controlling the at least one sensor,
   wherein the at least one first electronic device and the at least one second electronic device are electrically conductively connected to one another via a contacting unit, the contacting unit being removably located in a recess of the partition wall,
   wherein a non-removable connection is provided between the contacting unit and the at least one first electronic device so that the contacting unit and the at least one first electronic device are able to be handled as one component so as to facilitate installation and replacement of the contacting unit and the at least one first electronic device together as a single assembly, wherein the contacting unit has contact elements in the form of at least one of network contact elements or signal contact elements for transmitting electrical signals, and wherein the at least one of the network contact elements or the signal contact elements are at least partially substance bonded to the at least one first electronic device.

2. Measuring device according to claim 1, wherein the contacting unit is an electrical feedthrough element.

3. Measuring device according to claim 2, wherein the electrical feedthrough element is a plug with contact elements and wherein the plug is enclosed in a metal cylinder.

4. Measuring device according to claim 1, wherein the contact elements comprise both the network contact elements and signal contact elements, wherein the at least one first electronic device is fixedly connected with the network contact elements and the signal contact elements of the contacting unit and has means for increasing a distance between the network contact elements and the signal contact elements or between the signal contact elements or between the network contact elements.

5. Measuring device according to claim 4, wherein the signal contact elements are arranged circularly in at least one circle around at least one of the network contact elements.

6. Measuring device according to claim 4, wherein the signal contact elements are arranged, around the at least one of the network contact elements in such a manner that the distance between the at least one of the network contact elements and the signal contact elements is in accordance with at least a standardized minimum distance to ensure air and creep resistance.

7. Measuring device according to claim 4, wherein the signal contact elements are combined to form at least one circuit group, wherein the at least one circuit group has at least two of the signal contact elements.

8. Measuring device according to claim 7, wherein the contacting unit is at least a distance between two signal of the contact elements falls below a standardized minimum distance to comply with an air and/or creep resistance.

9. Measuring device according to claim 1 wherein the at least one second electronic device arranged in the electronics space has a terminal unit which is electrically conductively connected to the contacting unit.

10. Measuring device according to claim 9, wherein the terminal unit has connecting elements in the form of at least one of network connecting elements or signal connecting elements, wherein the network connecting elements or signal connecting elements are electrically conductively connected with the contact unit, wherein the terminal unit is arranged to float and wherein at least one of the network connecting elements or signal connecting elements or the contact unit has a self-centering connection.

11. Measuring device according to claim 10, wherein at least one of the network connecting elements or signal connecting elements or the contact unit are configured as funnel-shaped receptacles.

12. Transmitter housing, comprising:
at least one terminal space and
an electronics space adjacent to the terminal space and connected thereto via a partition wall,
at least one first electronic device for connection of supply or I/O lines arranged in the terminal space and
at least one second electronic device arranged in the electronics space with electronics for controlling at least one sensor,
wherein the at least one first electronic device and the at least one second electronic device are electrically conductively connected to one another via a contacting unit, wherein the contacting unit is removably inserted into a recess of the partition wall,
wherein a non-removable connection is provided between the contacting unit and the at least one first electronic device so that the contacting unit and the at least one first electronic device are able to be handled as one component, so as to facilitate installation and replacement of the contacting unit and the at least one first electronic device together as a single assembly,
wherein the transmitter housing is adapted for use in a measuring device having the at least one sensor,
wherein the contacting unit has contact elements in the form of at least one of network contact elements or signal contact elements for transmitting electrical signals, and
wherein the at least one of the network contact elements or the signal contact elements are at least partially substance bonded to the at least one first electronic device.

13. Method for producing a measuring device, wherein the measuring device has at least one sensor and at least one transmitter housing, wherein the transmitter housing has at least one terminal space and an electronics space adjacent to the terminal space and connected via a partition wall, wherein a first electronic device for connection of supply and/or I/O lines is arranged in the terminal space and a second electronic device with electronics for controlling the sensor is arranged in the electronics space, wherein the second electronic device arranged in the electronics space has a terminal unit,
wherein a contacting unit is provided, wherein a non-removable connection is provided between the contacting unit is fixedly connected to the at least one first electronic device so that the contacting unit and the at least one first electronic device are able to be handled as one component, so as to facilitate installation and replacement of the contacting unit and the at least one first electronic device together as a single assembly,
wherein the contacting unit has contact elements in the form of network contact elements and/or signal contact elements for transmitting electrical signals,
wherein the at least one of the network contact elements or the signal contact elements are at least partially substance bonded to the at least one first electronic device,
wherein the terminal unit has connecting elements in the form of network connecting elements and/or signal connecting elements, the method comprising the following steps:
installing the second electronic device in the electronics space, wherein the terminal unit is arranged to float,
installing the first electronic device in the terminal space, wherein the contacting unit is removably inserted into the partition wall,
handling the contacting unit and the first electronic device as one component and connecting the contacting unit to the terminal unit due to the installation of the first electronic device, and adapting the terminal unit by self-centering to a position of the contacting unit.

\* \* \* \* \*